US009666611B2

(12) United States Patent
Song et al.

(10) Patent No.: US 9,666,611 B2
(45) Date of Patent: May 30, 2017

(54) THIN FILM TRANSISTOR ARRAY PANEL

(71) Applicant: SAMSUNG DISPLAY CO., LTD, Yongin, Gyeonggi-do (KR)

(72) Inventors: Min-Chul Song, Seoul (KR); Man Hong Na, Seoul (KR); Young Je Cho, Asan-si (KR); Sung Man Kim, Seoul (KR); Sung-Hoon Lim, Gunsan-si (KR); Soo Jung Chae, Seoul (KR); Eu Gene Lee, Busan (KR)

(73) Assignee: SAMSUNG DISPLAY CO., LTD., Gyeonggi-Do (KR)

(*) Notice: Subject to any disclaimer, the term of this patent is extended or adjusted under 35 U.S.C. 154(b) by 0 days.

(21) Appl. No.: 14/853,635

(22) Filed: Sep. 14, 2015

(65) Prior Publication Data

US 2016/0005768 A1    Jan. 7, 2016

Related U.S. Application Data

(63) Continuation of application No. 13/616,165, filed on Sep. 14, 2012, now Pat. No. 9,136,283.

(30) Foreign Application Priority Data

Oct. 31, 2011   (KR) .................. 10-2011-0112342

(51) Int. Cl.
*H01L 29/04* (2006.01)
*H01L 27/12* (2006.01)

(52) U.S. Cl.
CPC .................. *H01L 27/124* (2013.01)

(58) Field of Classification Search
CPC .............. H01L 27/124; H01L 27/1259; H01L 27/2362; H01L 27/1251; H01L 27/3211; H01L 27/14609; H01L 27/1463; H01L 27/14641; H01L 27/3213; H01L 27/1285;
(Continued)

(56) References Cited

U.S. PATENT DOCUMENTS

| 6,028,577 A | 2/2000 | Sakamoto |
| 6,552,707 B1 | 4/2003 | Fujiyoshi |
| 7,863,612 B2 | 1/2011 | Sato |

(Continued)

FOREIGN PATENT DOCUMENTS

| KR | 1020060028970 A | 4/2006 |
| KR | 1020070006222 A | 1/2007 |

(Continued)

*Primary Examiner* — Yosef Gebreyesus
(74) *Attorney, Agent, or Firm* — Cantor Colburn LLP

(57) ABSTRACT

A thin film transistor array panel includes: a data line which extends in a column direction and transfers a data voltage; a first pixel electrode and a second pixel electrode connected to the data line and adjacent in a row direction; a first thin film transistor connected to the first pixel electrode and the data line, and including a first source electrode and a first drain electrode; and a second thin film transistor connected to the second pixel electrode and the data line, and including a second source electrode and a second drain electrode. The first pixel electrode is at the right of the data line, the second pixel electrode is at the left of the data line, and relative positions of the first source electrode and the first drain electrode are the same as relative positions of the second source electrode and the second drain electrode.

10 Claims, 11 Drawing Sheets

(58) Field of Classification Search
CPC .. H01L 27/3241; H01L 27/32; H01L 27/3293
See application file for complete search history.

(56) References Cited

U.S. PATENT DOCUMENTS

| | | | | |
|---|---|---|---|---|
| 2004/0169812 | A1* | 9/2004 | Kim | G02F 1/136209 349/187 |
| 2006/0034125 | A1* | 2/2006 | Kim | G09G 3/3648 365/185.22 |
| 2006/0120160 | A1* | 6/2006 | Park | G02F 1/1368 365/185.22 |
| 2006/0145156 | A1* | 7/2006 | Hong | G02F 1/136286 257/66 |
| 2006/0164350 | A1* | 7/2006 | Kim | G09G 3/3614 345/87 |
| 2007/0159571 | A1 | 7/2007 | Yang | |
| 2008/0042946 | A1 | 2/2008 | Park et al. | |
| 2010/0045883 | A1 | 2/2010 | Kim et al. | |
| 2010/0134429 | A1 | 6/2010 | You et al. | |
| 2010/0156954 | A1 | 6/2010 | Kim et al. | |
| 2011/0089422 | A1 | 4/2011 | Yoon et al. | |

FOREIGN PATENT DOCUMENTS

| | | |
|---|---|---|
| KR | 1020070080475 A | 8/2007 |
| KR | 1020070102125 A | 10/2007 |
| KR | 100783709 B1 | 12/2007 |
| KR | 1020080001106 A | 1/2008 |
| KR | 1020080002278 A | 1/2008 |
| KR | 1020080019800 A | 3/2008 |
| KR | 1020080062948 A | 7/2008 |
| KR | 1020080110124 A | 12/2008 |
| KR | 1020100021311 A | 2/2010 |
| KR | 1020110011309 A | 2/2011 |

* cited by examiner

THIN FILM TRANSISTOR ARRAY PANEL

This application is a continuation of U.S. patent application Ser. No. 13/616,165, filed on Sep. 14, 2012, which claims priority to and the benefit of Korean Patent Application No. 10-2011-0112342 filed in the Korean Intellectual Property Office on Oct. 31, 2011, the entire contents of which are incorporated herein by reference.

BACKGROUND OF THE INVENTION (a) Field of the Invention

The invention relates to a thin film transistor array panel.

(b) Description of the Related Art

The use of a flat panel display as a display device has grown rapidly while the flat panel display occupies a significantly large portion of the market. The flat panel display is a display device in which an overall thickness is relatively thin as compared to a size of a display screen of the display device. As a widely used flat panel display, for example, there are a liquid crystal display and an organic light emitting display.

The display device includes a display panel including pixels arranged in a matrix form, and a thin film transistor array panel which faces an opposite panel. Each pixel includes a pixel electrode, a common electrode, and a thin film transistor as a switching element that is connected to each pixel electrode. The thin film transistor is connected to a gate line that transfers a gate signal generated by a gate driver and to a data line that transfers a data signal generated by a data driver. The thin film transistor transfers the data signal to the pixel electrode or blocks the data signal according to the gate signal. Each pixel of the display device may display primary colors such as red, green and blue. The primary colors of each pixel may be displayed by disposing a color filter or an emission layer emitting light of an intrinsic color, on a region corresponding to each pixel.

In the case of the liquid crystal display, an electric field is generated in a liquid crystal layer by applying a voltage to the pixel electrode and common electrode. In order to prevent a degradation phenomenon generated by applying the electric field in one direction to the liquid crystal layer for a long time, a polarity of the data voltage with respect to the common voltage for each frame, each row or each pixel is inverted.

The gate driver and the data driver of the display device generally include a plurality of driver integrated circuit ("IC") chips, and since the data driver IC chip is more expensive than the gate driver IC chip, it is necessary to decrease the number of the data driver IC chip.

With respect to the connection relationship between the data line and pixel in decreasing the number of data driver IC chips, arrangements of the source electrode and drain electrode of the thin film transistor of a plurality of pixels disposed in the same pixel row or the same pixel column may be different from each other. Accordingly, in a manufacturing step of the thin film transistor array panel, in the case where misalignment occurs with the opposite panel, an overlapping area between the gate electrode and the source electrode, and between the gate electrode and the drain electrode is changed, such that a deviation of a kickback voltage occurs and a stain having a thin vertical line shape is observed by the deviation of the kickback voltage when inversion driving is performed.

BRIEF SUMMARY OF THE INVENTION

The invention has been made in an effort to remove a stain having a thin vertical line shape generated because structures and positions of thin film transistors are not identical with each other for each pixel.

Further, the invention has been made in an effort to improve an aperture ratio of a display device.

An exemplary embodiment of the invention provides a thin film transistor array panel, including: a first gate line and a second gate line that extend in a row direction, are disposed between two pixel rows that are adjacent to each other, and are adjacent to each other; a data line that extends in a column direction and transfers a data voltage; a first pixel electrode and a second pixel electrode that are connected to the data line and are adjacent in the row direction; a first thin film transistor that is connected to the first pixel electrode and the data line and includes a first source electrode and a first drain electrode; and a second thin film transistor that is connected to the second pixel electrode and the data line and includes a second source electrode and a second drain electrode. The second source electrode is connected to the data line through a first source connection portion, the first source connection portion is disposed between the first gate line and the second gate line, and relative positions of the first source electrode and the first drain electrode are the same as relative positions of the second source electrode and the second drain electrode.

The first pixel electrode may be disposed at the right or left of the data line, and the second pixel electrode may be disposed at an opposite side to the first pixel electrode with respect to the data line.

The first source electrode may be disposed at the left of the first drain electrode in the row direction, and the second source electrode may be disposed at the left of the second drain electrode.

The first source connection portion may not overlap the first gate line and the second gate line.

The first source electrode may be connected to the data line through a second source connection portion, and the second source connection portion may be longer than the first source connection portion.

The second source connection portion may be disposed between the first gate line and the second gate line.

The first source connection portion and the second source connection portion may overlap the first gate line and the second gate line.

Another exemplary embodiment of the invention provides a thin film transistor array panel, including: a plurality of pixel electrodes arranged in a matrix form; a plurality of gate lines that extend in a row direction and are in two-to-one correspondence with pixel electrode rows; and a plurality of data lines that extend in a column direction and are in one-to-two correspondence with pixel electrode columns. The plurality of pixel electrodes include a first pixel electrode and a second pixel electrode that are adjacent in a row direction with the first data line of the plurality of data lines disposed therebetween. The first pixel electrode is connected to a first source electrode connected to the first data line, a first drain electrode facing the first source electrode, and a first thin film transistor including a first gate electrode. The second pixel electrode is connected to a second source electrode connected to a second data line that is adjacent to the first data line, a second drain electrode facing the second source electrode, and a second thin film transistor including a second gate electrode. The second source electrode is connected to the second data line through a first source connection portion, the first source connection portion is disposed between two pixel electrode rows that are adjacent to each other, and is disposed between the first gate line and the second gate line that are adjacent to each other among the plurality of gate lines. Relative positions of the first source electrode and the first drain electrode are the same as relative positions of the second source electrode and the second drain electrode.

With respect to one pixel row, the first thin film transistor may be disposed at an upper side or a lower side of the one pixel row, and the second thin film transistor may be disposed at an opposite side to the first thin film transistor.

According to exemplary embodiments of the invention, it is possible to decrease a vertical line stain due to a deviation of a kickback voltage between a plurality of pixels by decreasing the deviation of the kickback voltage due to a misalignment by arranging a source electrode and a drain electrode of a plurality of thin film transistors disposed on a plurality of pixels in a constant direction.

BRIEF DESCRIPTION OF THE DRAWINGS

The above and other features of the invention will become more apparent by describing in further detail exemplary embodiments thereof with reference to the accompanying drawings, in which.

DETAILED DESCRIPTION OF THE INVENTION

Figure 1:
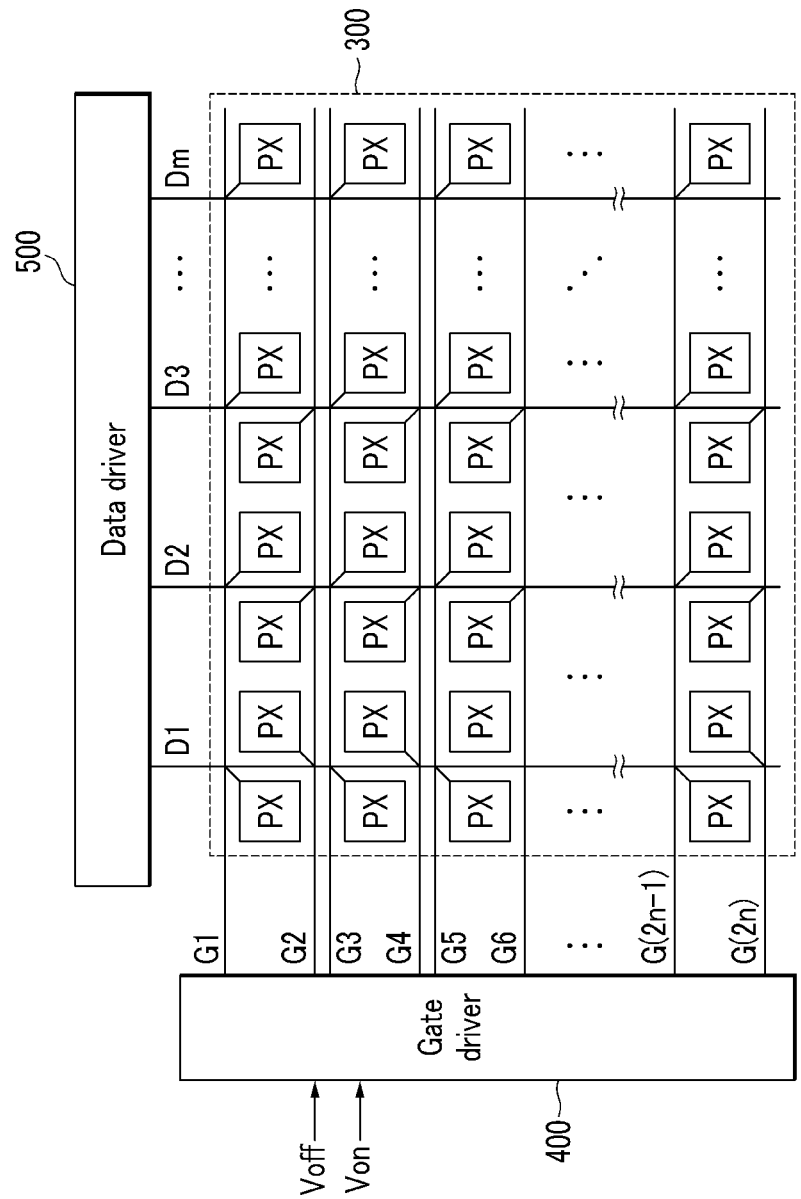
FIGS. 1 and 2 are block diagrams of an exemplary embodiment of a display device including a thin film transistor array panel according to the invention.

The invention will be described more fully hereinafter with reference to the accompanying drawings, in which exemplary embodiments of the invention are shown. As those skilled in the art would realize, the described embodiments may be modified in various different ways, all without departing from the spirit or scope of the invention.

In the drawings, the thickness of layers, films, panels, regions, etc., are exaggerated for clarity. Like reference numerals designate like elements throughout the specification. It will be understood that when an element such as a layer, film, region or substrate is referred to as being "on" another element, it can be directly on the other element or intervening elements may also be present. In contrast, when an element is referred to as being "directly on" another element, there are no intervening elements present.

It will be understood that, although the terms first, second, third, etc., may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the invention.

Spatially relative terms, such as "beneath," "below," "lower," "under," "above," "upper" and the like, may be used herein for ease of description to describe the relationship of one element or feature to another element(s) or feature(s) as illustrated in the figures. It will be understood that the spatially relative terms are intended to encompass different orientations of the device in use or operation, in addition to the orientation depicted in the figures. For example, if the device in the figures is turned over, elements described as "below" or "beneath" relative to other elements or features would then be oriented "above" relative to the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the invention. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements and/or components, but do not preclude the presence or addition of one or more other features, integers, steps, operations, elements, components and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, exemplary embodiments of a thin film transistor array panel according to the invention and a display device including the same will be described in detail with reference to the drawings.

Figure 2:
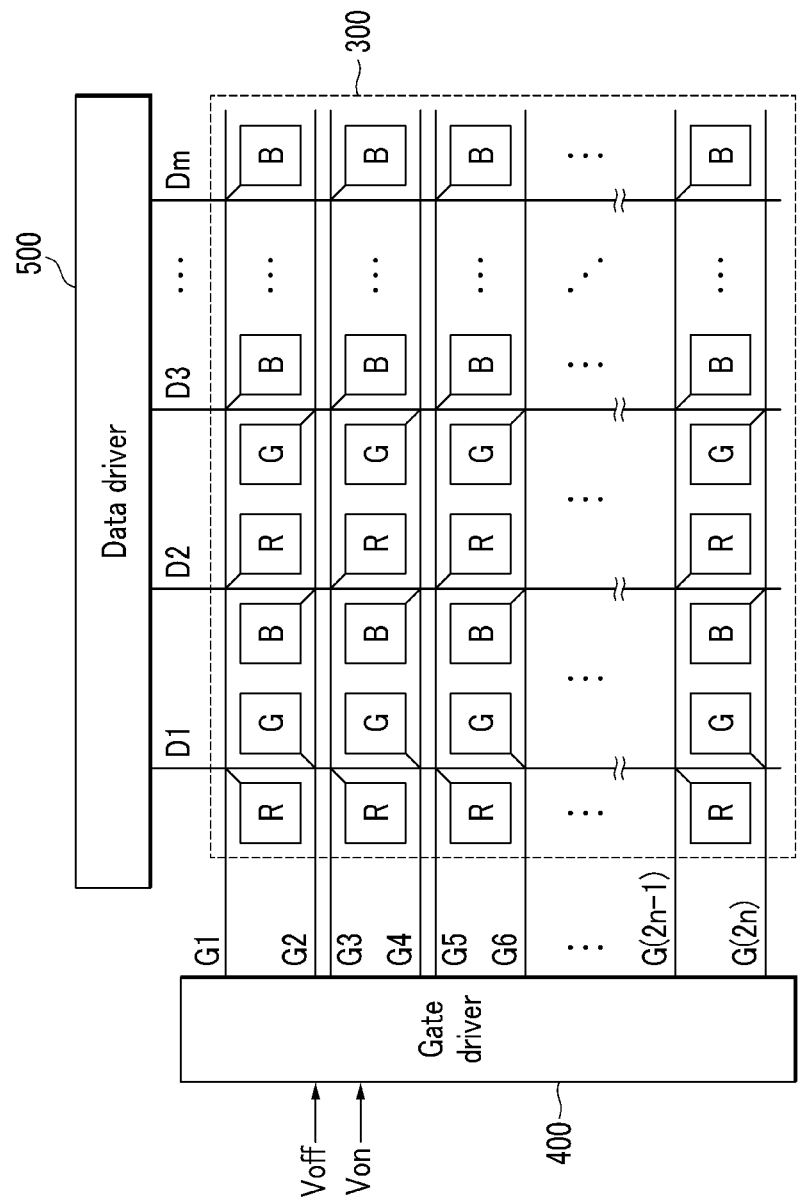

FIGS. 1 and 2 are block diagrams of an exemplary embodiment of a display device including a thin film transistor array panel according to the invention.

With reference to FIG. 1 and FIG. 2, the display device includes a display panel assembly 300, and a gate driver 400 and a data driver 500 connected thereto.

The display panel assembly 300 includes a plurality of display signal lines G1-G(2n) and D1-Dm, and a plurality of pixels PX, R, G and B that are connected to the display signal lines and arranged in an substantially matrix form.

In order to implement color displaying, each pixel PX, R, G and B displays one of a plurality of primary colors, and a desired color is recognized by a spatial and temporal sum of the primary colors. The primary color may include, but are not limited to, three primary colors such as red, green and blue ("RGB").

The display signal lines G1-G(2n) and D1-Dm include a plurality of gate lines G1-G(2n) that transfer a gate signal (referred to as "scanning signal") and a plurality of data lines D1-Dm that transfer a data signal. The gate lines G1-G(2n) have a longitudinal axis which extends in an approximate row direction and are parallel to each other, and the data lines D1-Dm have a longitudinal axis which extends in an approximate column direction and are almost parallel to each other. The display signal lines G1-G(2n) and D1-Dm may be on a thin film transistor array panel included in the display panel assembly 300.

Each pixel PX, R, G and B includes a pixel electrode (not shown) that receives a data signal through a switching element (not shown) such as a thin film transistor connected to the gate line G1-G(2n) and data line D1-Dm, and a common electrode (not shown) that faces the pixel electrode and receives a common voltage Vcom. The pixels PX, R, G and B are arranged in pixel rows which extend in the row direction and in pixel columns which extend in the column direction.

Since the gate lines of a pair of gate lines G1 and G2, G3 and G4, . . . are respectively above and beneath each one pixel row, the pixel PX, R, G or B of one pixel row is connected to either one of the pair of gate lines G1 and G2, G3 and G4, . . . that are respectively adjacent above and beneath the one pixel row.

Further, one data line D1-Dm is disposed for every two pixel columns. As illustrated in FIGS. 1 and 2, since one data line D1-Dm is disposed between a pair of adjacent pixel columns, the pixel PX, R, G or B of the odd numbered pixel column is connected to the respective data line D1-Dm that is directly adjacent at a first side (e.g., at the right) thereof through the switching element, and the pixel PX, R, G or B of the even numbered pixel column is connected to the respective data line D1-Dm that is directly adjacent at a second side opposing the first side (e.g., at the left) thereof through the switching element.

The gate driver 400 is connected to the gate lines G1-G(2n) of the display panel assembly 300, and applies a gate signal including a combination of a gate-on voltage Von that can turn on the switching element and a gate-off voltage Voff that can turn off the switching element to the gate lines G1-G(2n).

The data driver 500 is connected to the data lines D1-Dm of the display panel assembly 300 and applies a data voltage to the data lines D1-Dm.

With reference to FIG. 2, a pixel column of red pixels R displaying a red color, a pixel column of green pixels G displaying a green color and a pixel column of blue pixels B displaying a blue color, are repeatedly and alternately arranged in the row direction.

All the red pixels R are connected to the odd-numbered gate lines G1, G3, . . . , and G(2n−1) that are disposed at an upper side of a pixel row. Referring to only the red pixels R that are adjacent or consecutive in the row direction, the red pixels R are connected to respective data lines D1-Dm that are disposed at different sides. In FIG. 2, for example, the red pixel R connected to a first data line D1 is connected to the first data line D1 disposed at the right thereof, but the red pixel R connected to a second data line D2 is connected to the second data line D2 disposed at the left thereof.

In contrast, all the green pixels G are connected to the even-numbered gate lines G2, G4, . . . , and G(2n−1) that are disposed at a lower side of a pixel row. Referring to only the green pixels G that are adjacent or consecutive in the row direction, the green pixels G are connected to respective data lines D1-Dm that are disposed at different sides.

In the case of the blue pixel B, the blue pixels B within each pixel row are alternately connected to the gate lines G1-G(2n) respectively disposed at upper and lower sides of the pixel row. Referring to only the blue pixels B that are adjacent or consecutive in a row direction, the blue pixels B are connected to the data lines D1-Dm that are disposed at different sides.

The connection relationship of the pixels PX, R, G or B disposed in the same pixel column, with respect to the gate lines G1-G(2n) and data lines D1-Dm, may be the same.

The connection relationship between the pixels R, G and B and the display signal lines G1-G(2n) and D1-Dm illustrated in FIG. 2 is only an example, and the connection relationship and disposition may be changed.

Hereinafter, a thin film transistor array panel according to the invention will be described in detail with reference to FIGS. 3 to 5.

Figure 3:
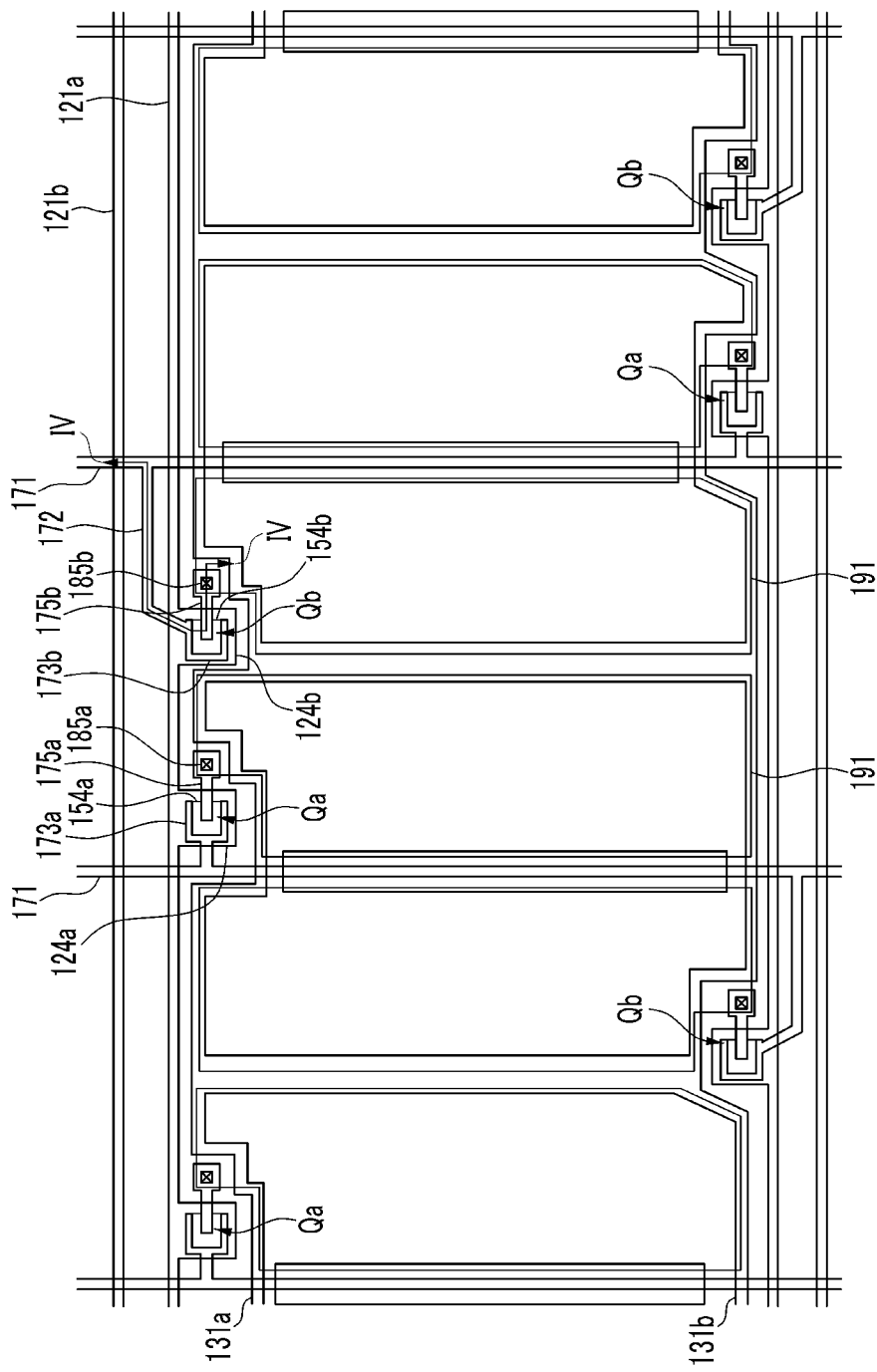
FIG. 3 is a plan view that illustrates an exemplary embodiment of a portion of the display device including the thin film transistor array panel according to the invention.
Figure 4:
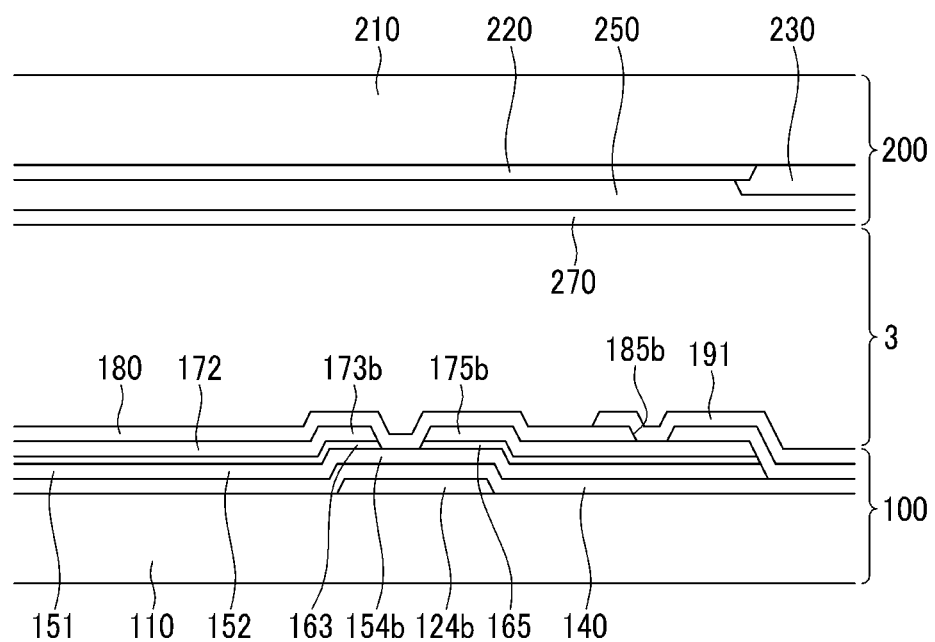
FIG. 4 is a cross-sectional view of the display device taken along line IV-IV of FIG. 3.
Figure 5:
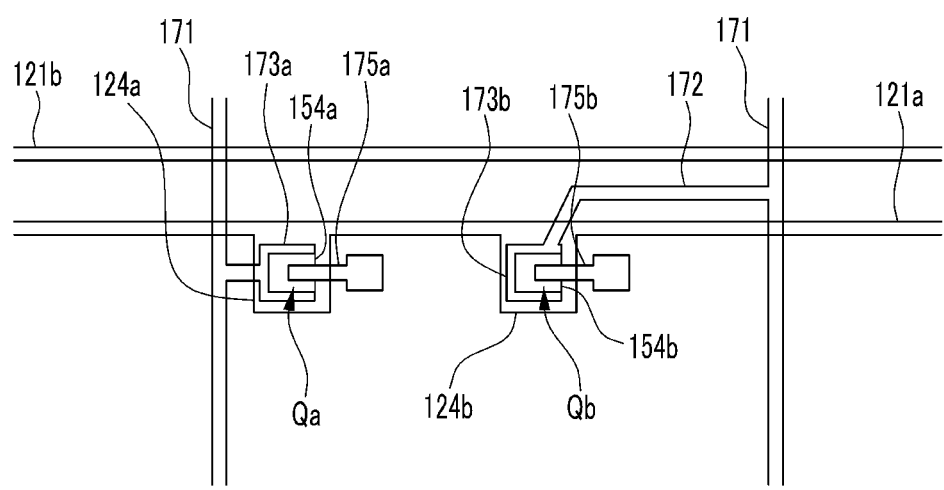
FIG. 5 is a plan view that illustrates a portion of the thin film transistor array panel of FIG. 3.

FIG. 3 is a plan view that illustrates an exemplary embodiment of a portion of the display device including the thin film transistor array panel according to the invention, FIG. 4 is a cross-sectional view of the display device taken along line IV-IV of FIG. 3 and FIG. 5 is a plan view that illustrates a portion of the thin film transistor array panel of FIG. 3.

In the exemplary embodiment, the display device including the thin film transistor array panel is a liquid crystal display.

The display device includes a thin film transistor array panel 100 and a common electrode panel 200 that face each other, and a liquid crystal layer 3 that is interposed between two display panels 100 and 200.

First, the common electrode panel 200 will be described. A light blocking member 220 and a plurality of color filters 230 are on an upper insulation substrate 210. Each color filter 230 may display any one of a plurality of primary colors such as three primary colors of red, green and blue. In an alternative exemplary embodiment, at least one of the color filter 230 and light blocking member 220 may be on the thin film transistor array panel 100.

An overcoat 250 is on the color filter 230 and light blocking member 220. A common electrode 270 is on the overcoat 250 and receives a common voltage Vcom.

Next, the thin film transistor array panel 100 will be described. A gate conductor including a plurality of first gate lines 121a and a plurality of second gate lines 121b, and a plurality of a plurality of storage voltage lines 131a and 131b, are on the lower insulation substrate 110.

The first gate line 121a and the second gate line 121b transmit gate signals, each have a longitudinal axis that mainly extends in a horizontal direction of the plan view, and are alternately disposed in a vertical direction of the plan view. The first gate line 121a and the second gate line 121b at opposing sides of a pixel row form a pair of gate lines. The first gate line 121a of a first pair of gate lines is closer to the second gate line 121b of a different second pair of gate lines and disposed at an upper side of the pixel row, than the second gate line 121b disposed at a lower side of the same pixel row.

Each gate line 121a and 121b includes a plurality of first and second gate electrodes 124a and 124b which extend directly from the respective gate line 121a or 121b.

A gate insulating layer 140 including silicon nitride (SiNx) or silicon oxide (SiOx) is on the gate lines 121a and 121b. A plurality of semiconductors 154a and 154b including hydrogenated amorphous silicon (amorphous silicon may be abbreviated as "a-Si") or polysilicon are on the gate insulating layer 140.

The semiconductors 154a and 154b include a first semiconductor 154a and a second semiconductor 154b respectively extending toward the first gate electrode 124a and the second gate electrode 124b. The second semiconductor 154b includes a portion 151 that has a longitudinal axis which extends in the vertical direction of the plan view, and a connection portion 152 that is continuous with and extends from the portion 151 to the second gate electrode 124b. The connection portion 152 includes a portion that substantially extends side by side (e.g., parallel) with the first and second gate lines 121a and 121b and between the first gate line 121a and the second gate line 121b that are directly adjacent thereto.

A plurality of ohmic contacts 163 and 165 are on the semiconductors 154a and 154b. The ohmic contact 163 and the ohmic contact 165 face each other with respect to the first and second gate electrodes 124a and 124b, form a pair of ohmic contacts and are disposed on the first and second semiconductors 154a and 154b.

A data conductor including a plurality of data lines 171 and a plurality of drain electrodes 175a and 175b are on the ohmic contacts 163 and 165 and on the gate insulating layer 140.

The data lines 171 transmit a data signal, each have a longitudinal axis which mainly extends in the vertical direction of the plan view, and crosses both the first and second gate lines 121a and 121b. Each data line 171 includes a first source electrode 173a and a second source electrode 173b that extend from a portion of the data line 171 mainly extending in the vertical direction and toward the first gate electrode 124a or the second gate electrode 124b to the right of the data line 171. A source connection portion 172 of the data line 171 is disposed between the portion of the data line 171 mainly extending in the vertical direction and the second source electrode 173b. The source connection portion 172 includes a portion that does not overlap the second gate electrode 124b, has the same planar shape as the connection portion 152 of the second semiconductor 154b, and substantially extends side by side (e.g., parallel) with the first gate line 121a and the second gate line 121b and between the first gate line 121a and the second gate line 121b that are directly adjacent thereto. The source connection portion 172, the second source electrode 173b and the data line 171 are collectively a single, unitary, indivisible member.

The source connection portion 172 extends to the left of each data line 171 in the plan view. The second source electrode 173b continuous with and connected to the source connection portion 172 may overlap the gate electrode that extends from the first gate line 121a (the case of the fourth pixel in FIG. 3), or overlap the gate electrode that extends from the second gate line 124b (the case of the second pixel and the sixth pixel in FIG. 3).

The first drain electrode 175a faces the first source electrode 173a with respect to the first gate electrode 124a, and includes a rod type first end portion partially surrounded by the bent first source electrode 173a and a relatively wide extended second end portion opposite to the first end portion. The second drain electrode 175b faces the second source electrode 173b with respect to the second gate electrode 124b, and includes a rod type first end portion partially surrounded by the bent second source electrode 173b and a relatively wide extended second end portion opposite to the first end portion.

The first gate electrode 124a, the first source electrode 173a and the first drain electrode 175a form a first thin film transistor ("TFT") Qa with the first semiconductor 154a, and a channel of the first thin film transistor Qa is on the first semiconductor 154a between the spaced apart first source electrode 173a and the first drain electrode 175a. The second gate electrode 124b, the second source electrode 173b and the second drain electrode 175b form a second thin film transistor Qb with the second semiconductor 154b, and a channel of the second thin film transistor Qb is on the second semiconductor 154b between the separated second source electrode 173b and the second drain electrode 175b. The first thin film transistor Qa is disposed at the right with respect to the data line 171, and the second thin film transistor Qb is disposed at the left with respect to the same data line 171.

In the exemplary embodiment of the invention, the second source electrode 173b of the second thin film transistor Qb disposed at the left of the data line 171 may be disposed to the left of the second drain electrode 175b facing the second source electrode 173b in the plan view, through the source connection portion 172. Accordingly, the positional relationship between the second source electrode 173b and the second drain electrode 175b of the second thin film transistor Qb may be the same as the positional relationship between the first source electrode 173a and the first drain electrode 175a of the first thin film transistor Qa. Particularly, the source electrodes 173a and 173b are both to the left of the respective drain electrode 175a and 175b of the thin film transistors Qa and Qb. That is, since the positional relationship of the first source electrode 173a with respect to the first drain electrode 175a of the first thin film transistor Qa is the same as the positional relationship of the second source electrode 173b with respect to the second drain electrode 175b of the second thin film transistor Qb, shapes and an arrangement of the first thin film transistor Qa and the second thin film transistor Qb are substantially the same as each other.

Gate conductors 121a and 121b and the data conductors 171, 175a and 175b may be formed by laminating a corresponding conductive material on the lower insulation substrate 110 through a photolithography process. The semiconductors 154a and 154b and the ohmic contacts 163 and 165 may be formed in a same process or step of forming the data conductors 171, 175a and 175b, such as through an exposure process using the same photomask as the data conductors 171, 175a and 175b.

When the gate conductors 121a and 121b and the data conductors 171, 175a and 175b are formed by different exposure processes as detailed above, the photomask for exposing a photosensitive film is not aligned at a precise position, such that an alignment error may be generated between the gate conductors 121a and 121b and the data conductors 171, 175a and 175b. Particularly, with reference to FIG. 5, in the case where the alignment error is generated in a parallel direction with the gate lines 121a and 121b, and between the gate conductors 121a and 121b and the data conductors 171, 175a and 175b, the data conductors 171, 175a and 175b are moved to the left or right from a target position with respect to the gate conductors 121a and 121b. If disposition or relative position of the source electrodes 173a and 173b and the drain electrodes 175a and 175b of the first thin film transistor Qa and the second thin film transistor Qb, respectively are different from each other, an overlapping (planar) area between the first drain electrode 175a and the first gate electrode 124a disposed at the right with respect to the left data line 171 becomes different from an overlapping area between the second drain electrode 175b and the second gate electrode 124b disposed at the left with respect to the right data line 171.

However, in the exemplary embodiment of the invention, in all pixels R, G and B, since the positional relationship of the first source electrode 173a with respect to the first drain electrode 175a of the first thin film transistor Qa disposed at the right with respect to the data line 171 and the positional relationship of the second source electrode 173b with respect to the second drain electrode 175b of the second thin film transistor Qb disposed at the left with respect to the data line 171 are the same as each other, shapes and an arrangement of the first thin film transistor Qa and the second thin film transistor Qb are substantially the same as each other. Accordingly, since the first drain electrode 175a and the second drain electrode 175b are identically disposed at the right of the first source electrode 173a and the second source electrode 173b, respectively, in the case where the data conductors 171, 175a and 175b are moved to the left with respect to the gate conductors 121a and 121b, an overlapping area between the first drain electrode 175a and the second drain electrode 175b and the first gate electrode 124a and the second gate electrode 124b is uniformly increased. Additionally, if the data conductors 171, 175a and 175b are moved to the right with respect to the gate conductors 121a and 121b, an overlapping area between the first drain electrode 175a and the second drain electrode 175b and the first gate electrode 124a and the second gate electrode 124b is uniformly decreased. Accordingly, a capacitance of a parasitic capacitor between the first drain electrode 175a and the second drain electrode 175b and the first gate electrode 124a and the second gate electrode 124b, respectively, is uniformly changed in all pixels R, G and B.

Further, since the source connection portion 172 of the thin film transistor array panel according to the invention is mostly disposed between the first gate line 121a and the second gate line 121b that are directly adjacent thereto, the source connection portion 172 is not disposed in a display area, such that it is possible to reduce or effectively prevent deterioration of an aperture ratio by the source connection portion 172. In more detail, since the source connection portion 172 is disposed between two gate lines 121a and 121b both disposed between two adjacent pixel rows, the source connection portion 172 is further disposed in a non-display area. Accordingly, it is possible to reduce or effectively prevent the deterioration of the aperture ratio by the source connection portion 172.

In the exemplary embodiment illustrated in FIGS. 3 to 5, the second source electrode 173b of the second thin film transistor Qb disposed at the left of the data line 171 is connected to the data line 171 through the source connection portion 172, such that all the first and second source electrodes 173a and 173b of the first and second thin film transistors Qa and Qb are disposed at the left of the first and the second drain electrodes 175a and 175b. In an alternative exemplary embodiment, the first source electrode 173a of the first thin film transistor Qa disposed at the right of the data line 171 is connected to the data line 171 through the source connection portion 172, and all the first and the second source electrodes 173a and 173b of the first and second thin film transistors Qa and Qb may be disposed at the right of the first and second drain electrodes 175a and 175b, respectively. In this case, a capacitance of a parasitic capacitor between the drain electrodes 175a and 175b and the first gate electrode 124a or the second gate electrode 124b may be uniformly changed in all pixels R, G and B.

The ohmic contacts 163 and 165 are present only between the semiconductors 154a and 154b that are disposed thereebeneath and the data conductors 171, 175a and 175b that are disposed thereabove, and lower contact resistance therebetween. The semiconductors 154a and 154b include exposed portions between the first source electrode 173a and the first drain electrode 175a, and between the second source electrode 173b and the second drain electrode, that are not covered or overlapped with the data conductors 171, 175a and 175b.

A passivation layer 180 is on the data conductors 171, 175a and 175b and the exposed portions of the semiconductors 154a and 154b. The passivation layer 180 includes a plurality of first and second contact holes 185a and 185b that expose extended portions of the first and second drain electrode 175a and 175b, respectively, and are extended completely through a thickness thereof.

A plurality of pixel electrodes 191 are on the passivation layer 180. The pixel electrode 191 may include a transparent conductive material such as indium tin oxide ("ITO") or indium zinc oxide ("IZO"), or reflective metal such as aluminum, silver, chromium or an alloy thereof.

The pixel electrodes 191 are physically and electrically connected to the first and second drain electrodes 175a and 175b through the first and second contact holes 185a and 185b and receive the data voltage from the first and second drain electrodes 175a and 175b, respectively. The pixel electrode 191 to which the data voltage is applied generates an electric field in conjunction with the common electrode 270 of the common electrode panel 200 to determine a direction of liquid crystal molecules of the liquid crystal layer 3 between the two electrodes 191 and 270. As described above, according to the determined direction of the liquid crystal molecules, the polarization of light that passes through the liquid crystal layer 3 is changed. The pixel electrode 191 and the common electrode 270 form a liquid crystal capacitor in conjunction with a liquid crystal layer portion 3 therebetween, such that the applied voltage is maintained even after the first and second thin film transistors Qa and Qb are turned off.

As described above, in all pixels R, G and B, since the respective overlapping area between the first and second drain electrodes 175a and 175b and the first and second gate electrodes 124a and 124b is uniformly changed by the alignment error, when a gate-off voltage Voff is applied to the first gate line 121a or the second gate line 121b, a kickback voltage decreasing a data voltage applied to the pixel electrode 191 also becomes uniform, such that display defects such as a stain having a vertical line shape according to the deviation of the kickback voltage may be decreased.

As described above, in the case where one data line 171 is disposed for every two pixel electrode columns and the first and second thin film transistors Qa and Qb connected to the data line 171 are disposed at the left and right of the data line 171, respectively, it is possible to decrease the deviation of the kickback voltage and decrease the vertical line stain by making the positional relationship of the source electrodes 173a and 173b and the drain electrodes 175a and 175b of the first thin film transistor Qa and the second thin film transistor Qb constant through an element such as the source connection portion 172. The method for making the positional relationships of the source electrodes 173a and 173b and the drain electrodes 175a and 175b of the first thin film transistor Qa and the second thin film transistor Qb constant is not limited to the exemplary embodiment of the invention.

In the exemplary embodiment illustrated in FIGS. 3 to 5, upper and lower positions of the thin film transistors Qa and Qb of pixels connected to a single data line 171, that is, the first gate line 121a and the second gate line 121b to which the thin film transistors Qa and Qb are connected, may be changed unlike in FIGS. 3 to 5 and FIG. 2. For example, regardless of the kind of pixels R, G and B, the upper and lower positions of the first and second thin film transistors Qa and Qb connected at the left and right of the data line 171 may be constant for each data line 171.

Figure 6:
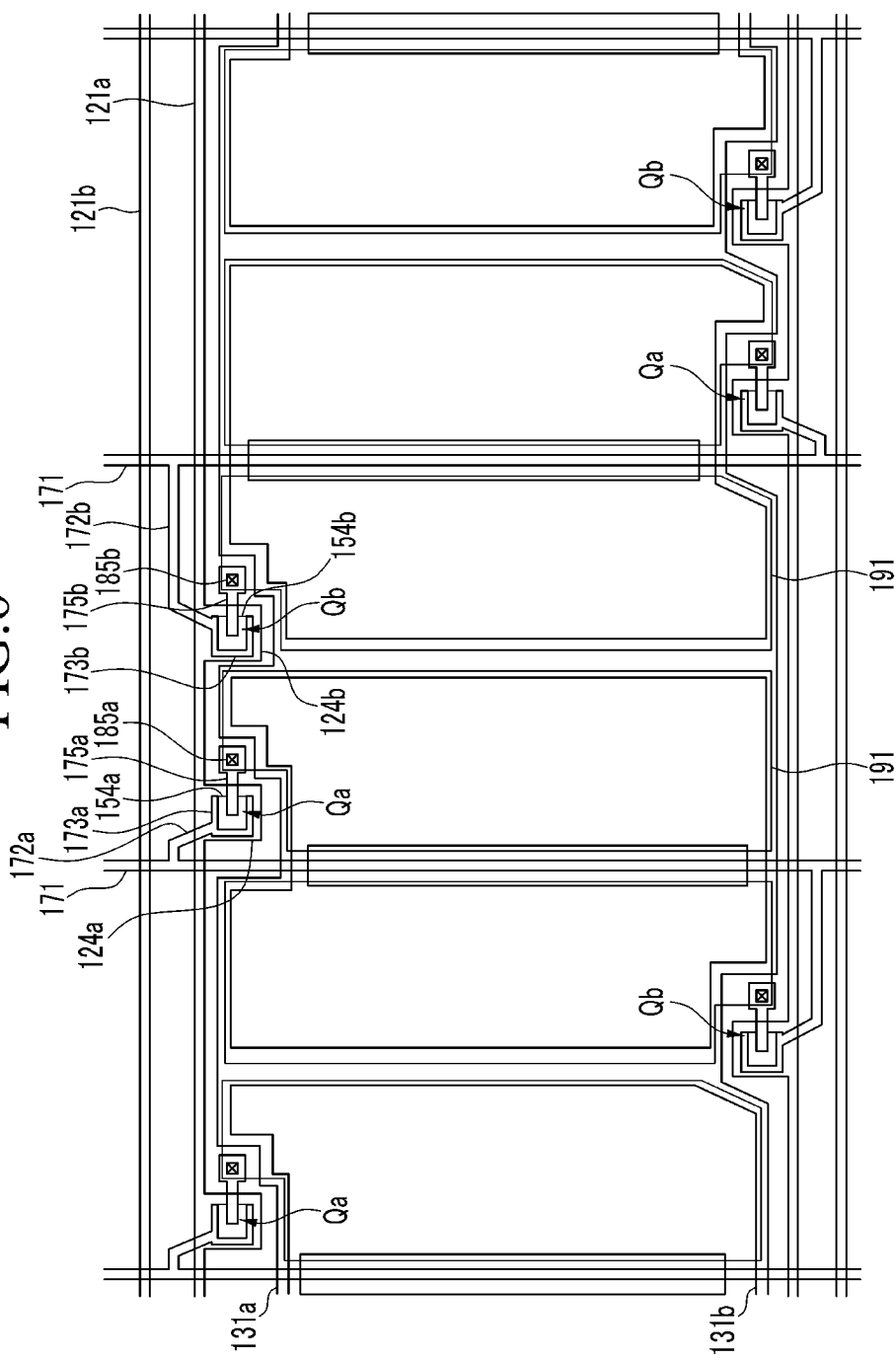
FIG. 6 is a plan view that illustrates another exemplary embodiment of a portion of a display device including a thin film transistor array panel according to the invention.

Another exemplary embodiment of a thin film transistor array panel according to the invention will be described with reference to FIG. 6 and FIG. 7. FIG. 6 is a plan view that illustrates another exemplary embodiment of a portion of a display device including a thin film transistor array panel according to the invention, and FIG. 7 is a plan view that illustrates a portion of the thin film transistor array panel of FIG. 6.

Figure 7:
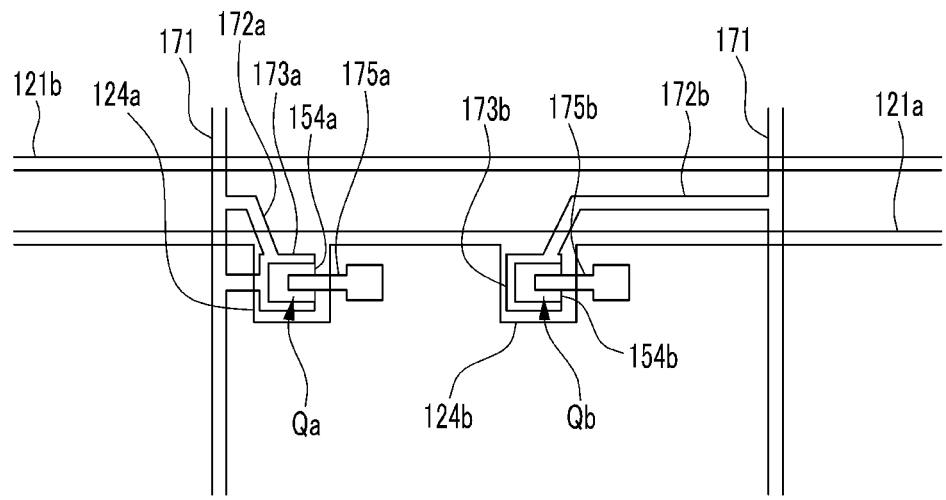
FIG. 7 is a plan view that illustrates a portion of the thin film transistor array panel of FIG. 6.

Referring to FIGS. 6 and 7, the exemplary embodiment of the thin film transistor array panel is similar to the thin film transistor array panel of the exemplary embodiment shown in FIGS. 3 to 5. Similar constituent elements are the same as the exemplary embodiment illustrated in FIGS. 3 to 5, and a description thereof will be omitted.

In the exemplary embodiment of the thin film transistor array panel in FIGS. 6 and 7, unlike the thin film transistor array panel of the exemplary embodiment illustrated in FIGS. 3 to 5, a first source electrode 173a of a first thin film transistor Qa disposed at the right of a data line 171 is connected to the data line 171 through a first source connection portion 172a, and a second source electrode 173b of a second thin film transistor Qb disposed at the left of an the data line 171 is connected to the data line 171 through a second source connection portion 172b. In this case, the first source connection portion 172a is shorter than the second source connection portion 172b.

The first source connection portion 172a and the second source connection portion 172b include a portion that partially overlaps with the gate lines 121a and 121b, and the first source connection portion 172a and the second source connection portion 172b do not overlap the first gate electrode 124a and the second gate electrode 124b. The first source connection portion 172a and the second source connection portion 172b also include a portion that substantially extends side by side (e.g., parallel) with the first and second gate lines 121a and 121b and between the first gate line 121a and the second gate line 121b that are directly adjacent thereto.

The first gate electrode 124a, the first source electrode 173a and the first drain electrode 175a form a first thin film transistor ("TFT") Qa with the first semiconductor 154a, and a channel of the first thin film transistor Qa is on the first semiconductor 154a between the first source electrode 173a and the first drain electrode 175a. Further, the second gate electrode 124b, the second source electrode 173b and the second drain electrode 175b form a second thin film transistor Qb with the second semiconductor 154b, and a channel of the second thin film transistor Qb is on the second semiconductor 154b between the second source electrode 173b and the second drain electrode 175b. The first thin film transistor Qa is disposed at the right of the data line 171, and the second thin film transistor Qb is disposed at the left of the same data line 171.

In the exemplary embodiment of the thin film transistor, since all the first source electrodes 173a and the second source electrodes 173b of the first thin film transistor Qa and the second thin film transistor Qb disposed at the right and left of the data line 171 are connected to the data line 171 through the first source connection portion 172a and the second source connection portion 172b that partially overlap the gate lines 121a and 121b, respectively, a difference in parasitic capacitance according to a difference between an overlapping (planar) area between the first source electrode 173a and the gate lines 121a and 121b of the first thin film transistor Qa and an overlapping area between the second source electrode 173b and gate lines 121a and 121b of the second thin film transistor Qb may be effectively eliminated. Accordingly, it is possible to reduce or effectively prevent deterioration in display quality according to the difference in parasitic capacitance between the first thin film transistor Qa and the second thin film transistor Qb disposed at the right and left of the data line 171.

In the exemplary embodiment of the thin film transistor array panel of FIGS. 6 and 7, like the thin film transistor array panel of the exemplary embodiment described with reference to FIGS. 3 to 5, the positional relationship between the second source electrode 173b and the second drain electrode 175b of the second thin film transistor Qb may be the same as the positional relationship between the first source electrode 173a and the first drain electrode 175a of the first thin film transistor Qa. That is, since the positional relationship of the first source electrode 173a with respect to the first drain electrode 175a of the first thin film transistor Qa is the same as the position relationship of the second source electrode 173b with respect to the second drain electrode 175b of the second thin film transistor Qb, shapes and an arrangement of the first thin film transistor Qa and the second thin film transistor Qb are substantially the same as each other. Accordingly, a capacitance of a parasitic capacitor between the first drain electrode 175a and the second drain electrode 175b and the first gate electrode 124a and the second gate electrode 124b, respectively, is uniformly changed in all pixels R, G and B.

Further, since the exemplary embodiment of the first and second source connection portions 172a and 172b of the thin film transistor array panel according to the invention are mostly disposed between the first gate line 121a and the second gate line 121b that are directly adjacent thereto, the source connection portions 172a and 172b are not disposed in a display area, such that it is possible to reduce or effectively prevent deterioration of an aperture ratio by the first and second source connection portions 172a and 172b. In more detail, since the first and second source connection portions 172a and 172b are disposed between two gate lines 121a and 121b both disposed between two adjacent pixel rows, the source connection portions 172a and 172b are disposed in a non-display area. Accordingly, it is possible to reduce or effectively prevent deterioration of an aperture ratio by the first and second source connection portions 172a and 172b.

All characteristics of the thin film transistor array panel of the exemplary embodiment described with reference to FIGS. 3 to 5 can be applied to the thin film transistor array panel of the exemplary embodiment described with reference to FIGS. 6 and 7.

Figure 8:
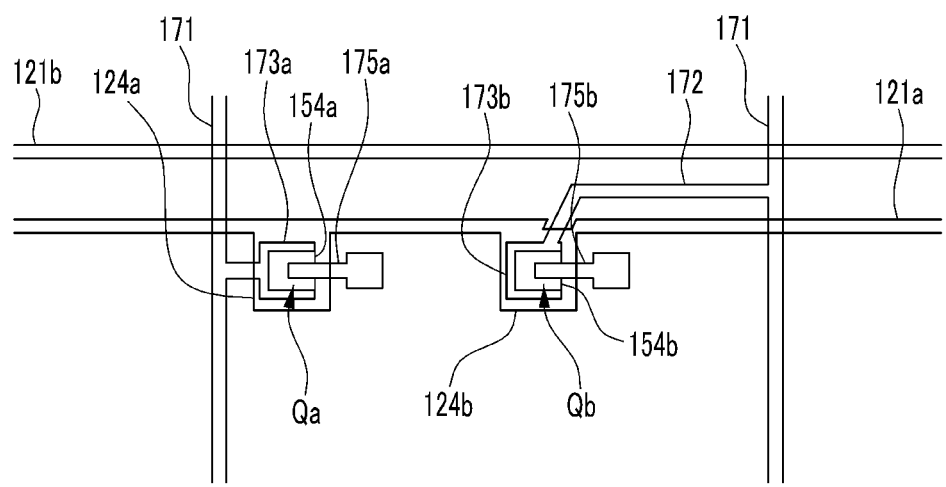
FIG. 8 is a plan view that illustrates yet another exemplary embodiment of a portion of a thin film transistor array panel according to the invention.

Yet another exemplary embodiment of a thin film transistor array panel according to the invention will be described with reference to FIG. 8. FIG. 8 is a plan view that illustrates yet another exemplary embodiment of a portion of a thin film transistor array panel according to the invention.

Referring to FIG. 8, the exemplary embodiment of the thin film transistor array panel is similar to the thin film transistor array panel of the exemplary embodiment shown in FIGS. 3 to 5. Similar constituent elements are the same as the exemplary embodiment illustrated in FIGS. 3 to 5, and a description thereof will be omitted.

Unlike the thin film transistor array panel of the exemplary embodiment illustrated in FIGS. 3 to 5, in the exemplary embodiment of the thin film transistor array panel in FIG. 8, a source connection portion 172 that is connected to a second source electrode 173b of a second thin film transistor Qb at the left of a data line 171 does not overlap gate lines 121a and 121b. The second gate line 121b includes a notch or recess such that the source connection portion 172 does not overlap the second gate line 121b. Thereby, it is possible to eliminate a difference in parasitic capacitance according to a difference between an overlapping (planar) area between a first source electrode 173a and the gate lines 121a and 121b of a first thin film transistor Qa and an overlapping area between the second source electrode 173b and the gate lines 121a and 121b of the second thin film transistor Qb. Accordingly, it is possible to reduce or effectively prevent deterioration in display quality according to a difference in parasitic capacitance between the first thin film transistor Qa and the second thin film transistor Qb disposed and the right and left of the data line 171.

In the exemplary embodiment of the thin film transistor array panel of FIG. 8, like the thin film transistor array panel of the exemplary embodiment described above with reference to FIGS. 3 to 5, the positional relationship between the second source electrode 173b and the second drain electrode 175b of the second thin film transistor Qb may be the same as the positional relationship between the first source electrode 173a and the first drain electrode 175a of the first thin film transistor Qa. That is, since the positional relationship of the first source electrode 173a with respect to the first drain electrode 175a of the first thin film transistor Qa is the same as the positional relationship of the second source electrode 173b with respect to the second drain electrode 175b of the second thin film transistor Qb, shapes and an arrangement of the first thin film transistor Qa and the second thin film transistor Qb are substantially the same as each other. Accordingly, a capacitance of a parasitic capacitor between the first drain electrode 175a and the second drain electrode 175b and the first gate electrode 124a and the second gate electrode 124b, respectively, is uniformly changed in all pixels R, G and B.

Further, since the exemplary embodiment of the source connection portion 172 of the thin film transistor array panel according to the invention is mostly disposed between the first gate line 121a and the second gate line 121b that are directly adjacent thereto, the source connection portion 172 is not disposed in a display area, such that it is possible to reduce or effectively prevent deterioration of an aperture ratio by the source connection portion 172. In more detail, since the source connection portion 172 is disposed between two gate lines 121a and 121b both disposed between two adjacent pixel rows, the source connection portion 172 is disposed in a non-display area. Accordingly, it is possible to reduce or effectively prevent the deterioration of the aperture ratio by the source connection portion 172.

In the above, all characteristics of the thin film transistor array panel of the exemplary embodiment described with reference to FIGS. 3 to 5 and the thin film transistor array panel of the exemplary embodiment described with reference to FIG. 6 and FIG. 7 may be applied to a thin film transistor array panel of the exemplary embodiment described with reference to FIG. 8.

Figure 9:
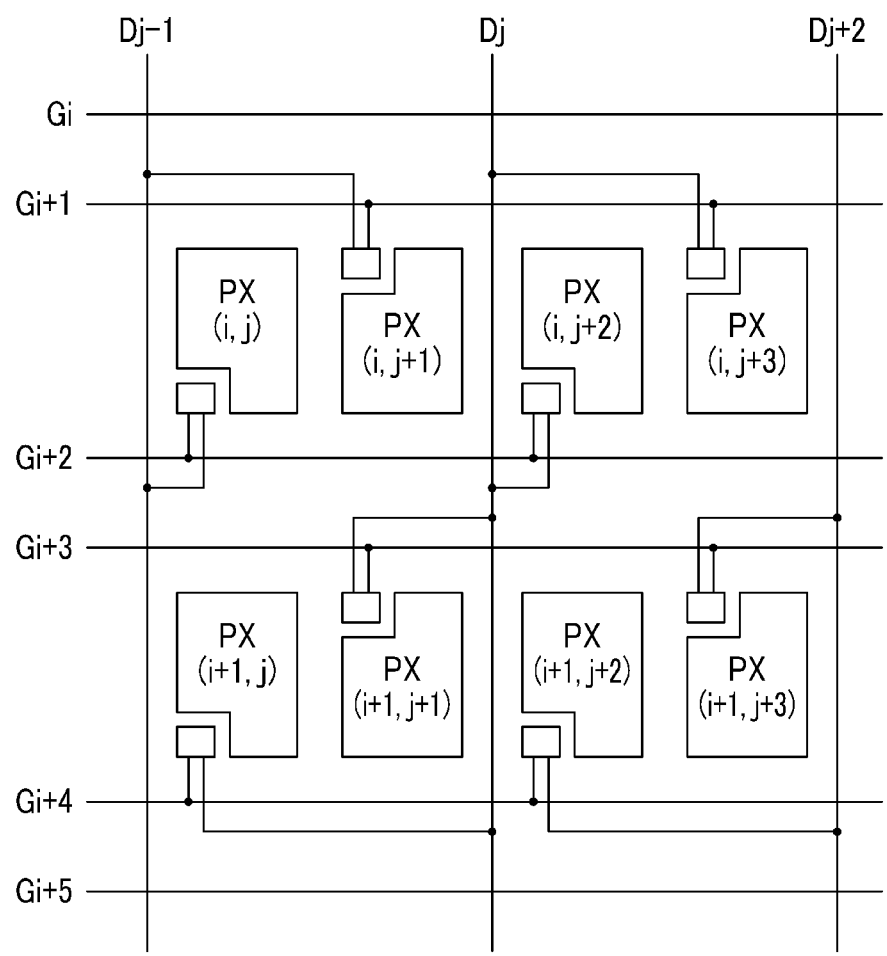
FIG. 9 is a view that illustrates still another exemplary embodiment of an arrangement of pixels of a thin film transistor array panel according to the invention.
Figure 10:
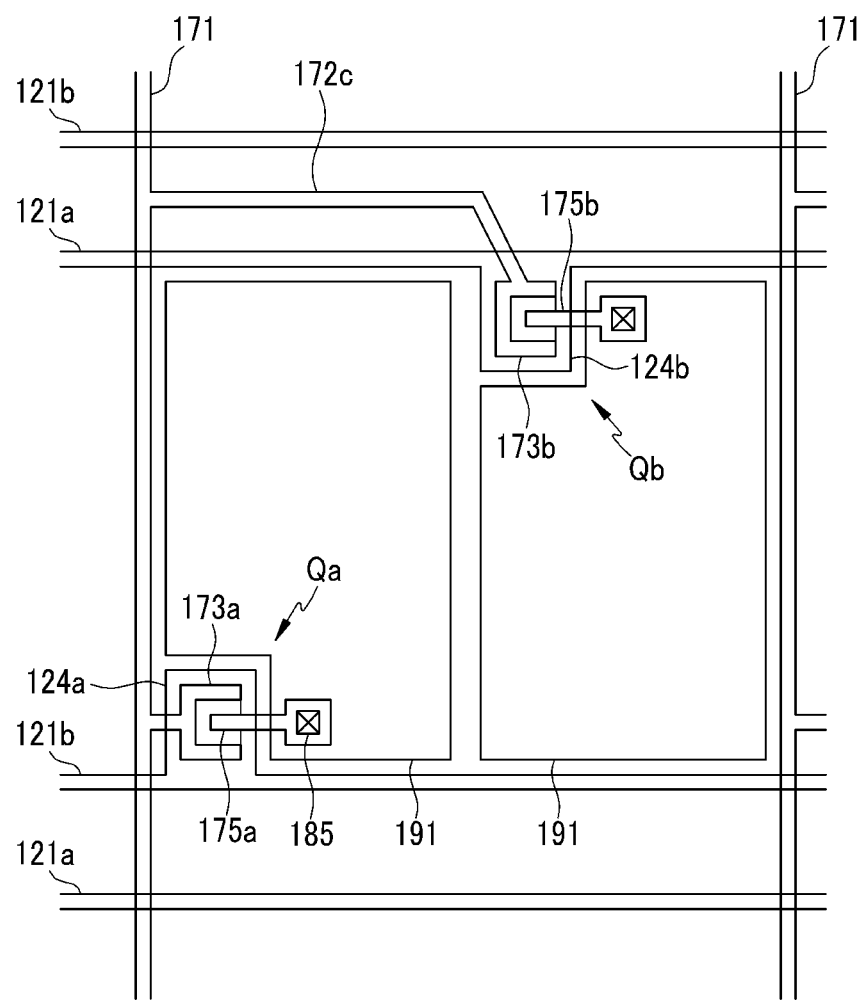
FIG. 10 is a plan view that schematically illustrates the thin film transistor array panel illustrated in FIG. 9.

Still another exemplary embodiment of a thin film transistor array panel according to the invention will be described with reference to FIG. 9 and FIG. 10. FIG. 9 is a view that illustrates another exemplary embodiment of an arrangement of pixels of the thin film transistor array panel according to the invention, and FIG. 10 is a plan view that schematically illustrates the thin film transistor array panel illustrated in FIG. 9.

With reference to FIG. 9, in the case of the exemplary embodiment of the thin film transistor array panel, similarly as the thin film transistor array panel of the exemplary embodiment as described above, a pair of gate lines Gi+1 and Gi+2, and Gi+3 and Gi+4 are disposed respectively above and beneath one row of pixels PX, and data lines Dj are disposed one between two columns of pixels PX.

Further, the thin film transistors Qa and Qb connected to a pair of pixels PX disposed between two data lines Dj−1 and Dj, and Dj and Dj+1 that are adjacent to each other in one pixel row are connected to different gate lines Gi+1 and Gi+2, and Gi+3 and Gi+4. In the exemplary embodiment, for example, the thin film transistors Qa disposed beneath the pixel PX is connected to the lower gate lines Gi+2 and Gi+4, and the thin film transistors Qb disposed above the pixel X is connected to the upper gate lines Gi+1 and Gi+3. In addition, a pair of pixels PX between two data lines are all connected to the same data lines Dj−1, Dj and Dj+1. Among a pair of pixels PX, the pixel PX that is disposed at a relatively far distance from the data lines Dj−1, Dj and Dj+1 compared to the other pixel PX of the pair is connected to the respective data line Dj−1, Dj and Dj+1 by a connection portion. The connection portion for connecting the data lines Dj−1, Dj and Dj+1 to the relatively far pixel PX is disposed between two gate lines directly adjacent to each other.

Further, two pairs of pixels PX that are adjacent in a column direction are connected to different data lines Dj−1 and Dj and Dj and Dj+1, and two pairs of pixels PX that are adjacent in a row direction are connected to different data lines Dj−1 and Dj, and Dj and Dj+1. The directions of the thin film transistors are the same as each other, for example, a first pixel PX closer to the data line of a pair of pixels PX is under the pixel PX and a second pixel PX further from the data line of the pair of pixels PX is above the pixel PX. As a result, in a 4×4 matrix structure, four pairs of pixels PX arranged in a matrix are repeatedly arranged in a row direction and a column direction.

With reference to FIG. 10, the thin film transistor array panel illustrated in FIG. 9 will be described.

Referring to FIG. 10, the exemplary embodiment of the thin film transistor array panel is similar to the thin film transistor array panel of the exemplary embodiment shown in FIGS. 3 to 5. Similar constituent elements are the same as the exemplary embodiment illustrated in FIGS. 3 to 5, and a description thereof will be omitted.

However, in the exemplary embodiment of the thin film transistor array panel of FIGS. 9 and 10, unlike the thin film transistor array panel of the exemplary embodiment illustrated in FIGS. 3 to 5, a first thin film transistor Qa is disposed at a lower side of the pixel PX, and a second thin film transistor Qb is disposed at an upper side of the pixel PX. Further, a second source electrode 173b of a second thin film transistor Qb is connected to a data line 171 through a third source connection portion 172c. The third source connection portion 172c is disposed between two pixel rows to thereby be disposed between two gate lines 121a and 121b that are adjacent to each other. The third source connection portion 172c includes a portion that substantially extends side by side (e.g., parallel) with the first and second gate lines 121a and 121b and between the first gate line 121a and the second gate line 121b that are directly adjacent thereto.

The first gate electrode 124a, the first source electrode 173a and the first drain electrode 175a form a first thin film transistor ("TFT") Qa with the first semiconductor 154a, and a channel of the first thin film transistor Qa is on the first semiconductor 154a between the first source electrode 173a and the first drain electrode 175a. Further, the second gate electrode 124b, the second source electrode 173b and the second drain electrode 175b form the second thin film transistor Qb with the second semiconductor 154b, and a channel of the second thin film transistor Qb is on the second semiconductor 154b between the second source electrode 173b and the second drain electrode 175b. The first thin film transistor Qa is disposed at the right of the data line 171, and the second thin film transistor Qb is disposed at the left of the same data line 171.

In the exemplary embodiment, the second source electrode 173b of the second thin film transistor Qb disposed at the left of the data line 171 may be disposed at the left of the second drain electrode 175b facing the second source electrode 173b, through the source connection portion 172c. Accordingly, the positional relationship between the second source electrode 173b and the second drain electrode 175b of the second thin film transistor Qb may be the same as the positional relationship between the first source electrode 173a and the first drain electrode 175a of the first thin film transistor Qa. That is, since the positional relationship of the first source electrode 173a with respect to the first drain electrode 175a of the first thin film transistor Qa is the same as the positional relationship of the second source electrode 173b with respect to the second drain electrode 175b of the second thin film transistor Qb, shapes and an arrangement of the first thin film transistor Qa and the second thin film transistor Qb are substantially the same as each other.

Accordingly, since the first drain electrode 175a and the second drain electrode 175b are identically disposed at the right of the first source electrode 173a and the second source electrode 173b, respectively, in the case where the data conductors 171, 175a and 175b are moved to the left with respect to the gate conductors 121a and 121b, an overlapping (planar) area between the first drain electrode 175a and the second drain electrode 175b and the first gate electrode 124a and the second gate electrode 124b is uniformly increased. Additionally, if the data conductors 171, 175a and 175b are moved to the right with respect to the gate conductors 121a and 121b, an overlapping area between the first drain electrode 175a and the second drain electrode 175b and the first gate electrode 124a and the second gate electrode 124b is uniformly decreased. Accordingly, a capacitance of a parasitic capacitor between the first drain electrode 175a and the second drain electrode 175b and the first gate electrode 124a and the second gate electrode 124b is uniformly changed in all pixels R, G and B.

Further, since the exemplary embodiment of the third source connection portion 172c of the thin film transistor array panel according to the invention is mostly disposed between the first gate line 121a and the second gate line 121b that are directly adjacent thereto, the third source connection portion 172c is not disposed in a display area, such that it is possible to reduce or effectively prevent deterioration of an aperture ratio by the source connection portion 172c. In more detail, since the third source connection portion 172c is disposed between two gate lines 121a and 121b both disposed between two adjacent pixel rows, the third source connection portion 172c is disposed in a non-display area. Accordingly, it is possible to prevent the deterioration of the aperture ratio by the third source connection portion 172c.

All characteristics of the thin film transistor array panels of the exemplary embodiment described with reference to FIGS. 3 to 5, FIG. 6 and FIG. 7, and FIG. 8 can be applied to the thin film transistor array panel of the exemplary embodiment described with reference to FIGS. 9 and 10.

Figure 11:
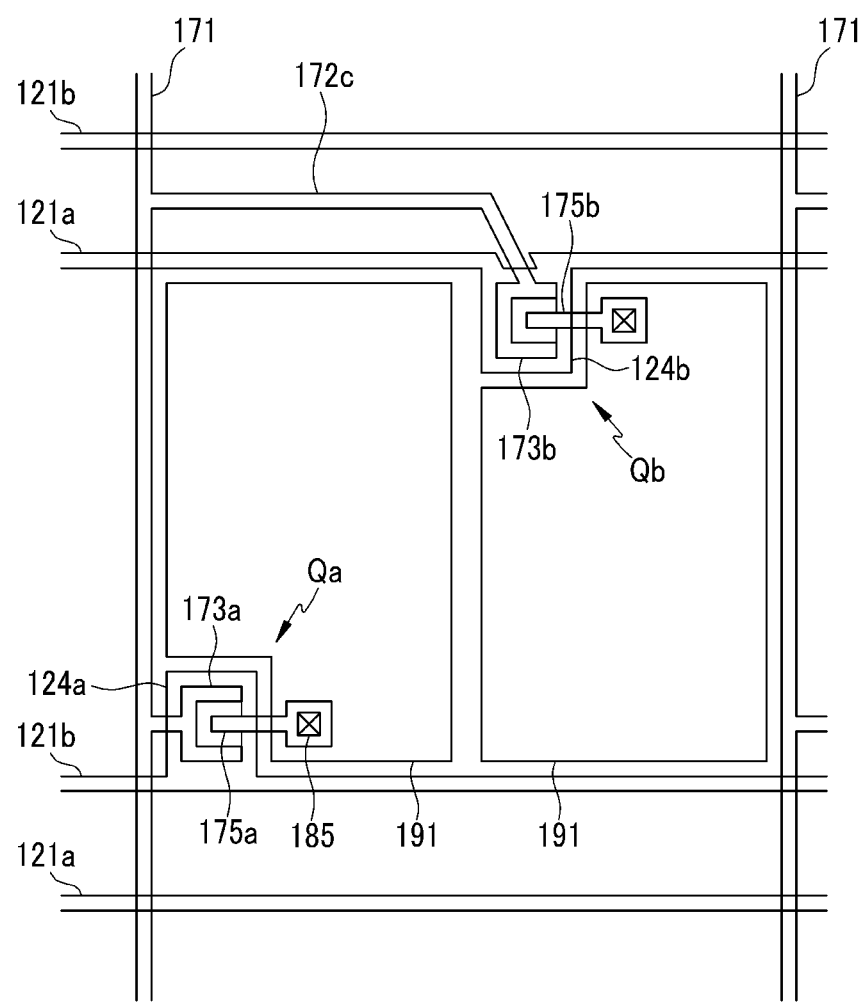
FIG. 11 is a plan view that illustrates another exemplary embodiment of a portion of the thin film transistor array panel of FIG. 9.

Still another exemplary embodiment of a thin film transistor array panel according to the invention will be described with reference to FIG. 11. FIG. 11 is a plan view that illustrates still another exemplary embodiment of a portion of a thin film transistor array panel illustrated in FIG. 9.

Referring to FIG. 11, the exemplary embodiment of the thin film transistor array panel is similar to the thin film transistor array panel of the exemplary embodiment shown in FIG. 9 and FIG. 10. Similar constituent elements are the same as the exemplary embodiment illustrated in FIG. 9 and FIG. 10, and a description thereof will be omitted.

However, unlike the exemplary embodiment of the thin film transistor array panel illustrated in FIG. 9 and FIG. 10, in the exemplary embodiment of the thin film transistor array panel of FIG. 11, the third source connection portion 172c that is connected to the second source electrode 173b of the second thin film transistor Qb disposed at the left of the data line 171 does not overlap the gate lines 121a and 121b. The first gate line 121a includes a notch or recess such that the source connection portion 172 does not overlap the first gate line 121a. Thereby, it is possible to eliminate a difference in parasitic capacitance according to a difference between an overlapping (planar) area between the first source electrode 173a and gate lines 121a and 121b of the first thin film transistor Qa and an overlapping area between the second source electrode 173b and gate lines 121a and 121b of the second thin film transistor Qb. Accordingly, it is possible to reduce or effectively prevent deterioration in display quality according to a difference in parasitic capacitance between the first thin film transistor Qa and the second thin film transistor Qb disposed and the right and left of the data line 171.

In the exemplary embodiment of the thin film transistor array panel of FIG. 11, like the thin film transistor array panel of the exemplary embodiment with reference to FIG. 9 and FIG. 10 as described above, since the positional relationship of the first source electrode 173a with respect to the first drain electrode 175a of the first thin film transistor Qa and the position relationship of the second source electrode 173b with respect to the second drain electrode 175b of the second thin film transistor Qb are the same as each other, shapes and an arrangement of the first thin film transistor Qa and the second thin film transistor Qb are substantially the same as each other. Accordingly, a capacitance of a parasitic capacitor between the first drain electrode 175a and the second drain electrode 175b and the first gate electrode 124a and the second gate electrode 124b is uniformly changed in all pixels R, G and B.

Further, since the exemplary embodiment of the third source connection portion 172c of the thin film transistor array panel according to the invention is mostly disposed between the first gate line 121a and the second gate line 121b that are directly adjacent thereto, the third source connection portion 172c is not disposed in a display area, such that it is possible to reduce or effectively prevent deterioration of an aperture ratio by the third source connection portion 172c. In more detail, since the third source connection portion 172c is disposed between two gate lines 121a and 121b both disposed between two adjacent pixel rows, the third source connection portion 172c is disposed in a non-display area. Accordingly, it is possible to reduce or effectively prevent the deterioration of the aperture ratio by the source connection portion 172c.

All characteristics of the thin film transistor array panel of the exemplary embodiment described with reference to FIGS. 3 to 5, FIG. 6 and FIG. 7, FIG. 8, and FIG. 9 and FIG. 10 can be applied to the thin film transistor array panel of the exemplary embodiment described with reference to FIG. 11.

Figure 12:
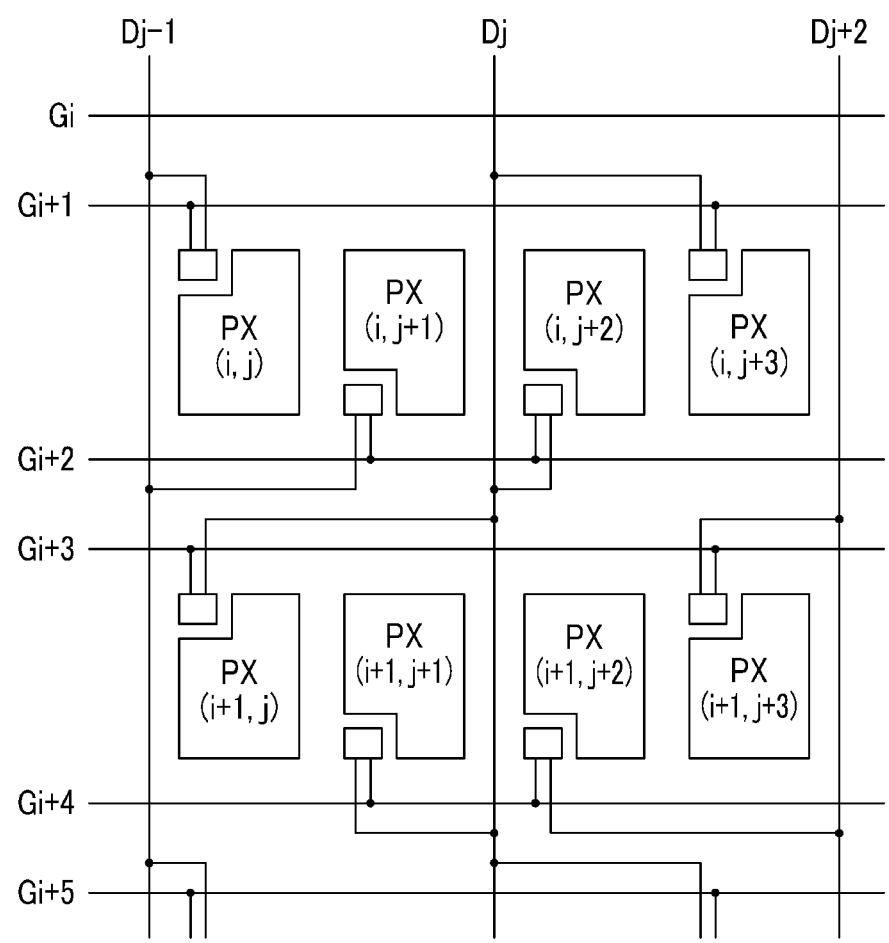
FIG. 12 is a view that illustrates yet another exemplary embodiment of an arrangement of pixels of a thin film transistor array panel according to the invention.

Still yet another exemplary embodiment of a thin film transistor array panel according to the invention will be described with reference to FIG. 12. FIG. 12 is a view that illustrates still yet another exemplary embodiment of an arrangement of pixels of the thin film transistor array panel according to the invention.

With reference to FIG. 12, in the case of the exemplary embodiment of the thin film transistor array panel, similarly as the thin film transistor array panel of the exemplary embodiment as described above, a pair of gate lines Gi+1 and Gi+2, and Gi+3 and Gi+4 are disposed respectively above and beneath one row of pixels PX, and data lines Dj are disposed one between two columns of pixels PX.

Further, the thin film transistors Qa and Qb connected to a pair of pixels PX disposed between two data lines Dj−1 and Dj, and Dj and Dj+1 that are adjacent to each other in one pixel row are connected to different gate lines Gi+1 and Gi+2, and Gi+3 and Gi+4. In the exemplary embodiment, for example, the thin film transistor Qa disposed beneath the pixel PX is connected to the lower gate lines Gi+2 and Gi+4, and the thin film transistor Qb disposed above the pixel PX is connected to the upper gate lines Gi+1 and Gi+3. In addition, a pair of pixels PX between two data lines are all connected to the same data lines Dj−1, Dj and Dj+1. Among a pair of pixels PX, the pixel PX that is disposed at a relatively far distance from the data lines Dj−1, Dj and Dj+1 compared to the other pixel is connected to the respective data line Dj−1, Dj and Dj+1 by a connection portion. The connection portion for connecting the data lines Dj−1, Dj and Dj+1 to the relatively far pixel PX is disposed between two adjacent gate lines.

Further, two pairs of pixels PX that are adjacent in a column direction are connected to different data lines Dj−1 and Dj, and Dj and Dj+1, and two pairs of pixels PX that are adjacent in a row direction are connected to different data lines Dj−1 and Dj, and Dj and Dj+1. The directions of the thin film transistors are the same as each other, for example, a first pixel PX further from the data line of a pair of pixels PX is under the pixel PX and a second pixel PX closer to the data line of the pair of pixels PX is above the pixel PX. As a result, in a 4×4 matrix structure, four pairs of pixels arranged in a matrix are repeatedly arranged in a row direction and a column direction.

Like the exemplary embodiments of the thin film transistor array panel as described above, the positional relationships of the source electrodes with respect to the drain electrodes of the thin film transistors Qa and Qb of two pixels PX that are adjacent to each other with respect to any one of the data lines Dj−1, Dj and Dj+1 may be the same as each other.

Accordingly, a capacitance of a parasitic capacitor between two drain electrodes and two gate electrodes of two thin film transistors Qa and Qb is uniformly changed in all pixels.

All characteristics of the exemplary embodiments of the thin film transistor array panel described with reference to FIGS. 3 to 5, FIG. 6 and FIG. 7, FIG. 8, FIG. 9 and FIG. 10, and FIG. 11 can be applied to the thin film transistor array panel of the exemplary embodiment described with reference to FIG. 12.

The various exemplary embodiments of the thin film transistor array panels according to the invention may be applied to various kinds of display devices in addition to the liquid crystal display.

While this invention has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. A thin film transistor array panel, comprising:
   a plurality of pixel electrodes in a matrix form, the plurality of pixel electrodes including a first pixel electrode row and a second pixel electrode row adjacent to each other;
   a plurality of gate lines which extend in a row direction and are in two-to-one correspondence with pixel electrode rows and include a first gate line and a second gate line are adjacent to each other between the first pixel electrode row and the second pixel electrode row and
   a plurality of data lines which extend in a column direction and are in one-to-two correspondence with pixel electrode columns,
   wherein
   the plurality of pixel electrodes includes a first pixel electrode and a second pixel electrode which are adjacent in a row direction, and the first pixel electrode and the second pixel electrode are between a first data line and a second data line of the plurality of data lines in a plan view,
   the first pixel electrode is connected to a first thin film transistor including a first gate electrode, a first source electrode connected to the first data line and a first drain electrode which faces the first source electrode,
   the second pixel electrode is connected to a second thin film transistor including a second gate electrode, a second source electrode connected to the second data line adjacent to the first data line, and a second drain electrode which faces the second source electrode,
   a first source connection portion connects the first source electrode to the first data line,
   a second source connection portion connects the second source electrode to the second data line,
   the first source connection portion and the second source connection portion are between the first pixel electrode row and the second pixel electrode row, the first source connection portion and the second source connection portion are between the same first gate line and the same second gate line, in the plan view, and
   relative positions of the first source electrode and the first drain electrode are the same as relative positions of the second source electrode and the second drain electrode.

2. The thin film transistor array panel of claim 1, wherein:
   the first pixel electrode is right or left of the first data line in the plan view, and
   the second pixel electrode is next to the first pixel electrode with respect to the first data line in the plan view.

3. The thin film transistor array panel of claim 2, wherein:
   the first source electrode is left of the first drain electrode in the row direction, and
   the second source electrode is left of the second drain electrode in the row direction.

4. The thin film transistor array panel of claim 2, wherein:
the second source connection portion is longer than the first source connection portion.

5. The thin film transistor array panel of claim 4, wherein:
the first source connection portion and the second source connection portion overlap the first gate line and the second gate line in the plan view.

6. The thin film transistor array panel of claim 5, wherein:
the first source electrode is left of the first drain electrode in the row direction, and
the second source electrode is left of the second drain electrode in the row direction.

7. The thin film transistor array panel of claim 1, wherein:
the first source electrode is left of the first drain electrode in the row direction, and
the second source electrode is left of the second drain electrode in the row direction.

8. The thin film transistor array panel of claim 1, wherein:
the first source connection portion does not overlap the first gate line and the second gate line in the plan view.

9. The thin film transistor array panel of claim 1, wherein:
the second source connection portion is longer than the first source connection portion.

10. The thin film transistor array panel of claim 1, wherein:
with respect to one pixel row,
the first thin film transistor is at an upper side or a lower side of the one pixel row in the plan view, and
the second thin film transistor is at an opposite side to the first thin film transistor in the plan view.

* * * * *